(12) United States Patent
Reay et al.

(10) Patent No.: US 10,965,303 B2
(45) Date of Patent: Mar. 30, 2021

(54) DATA CONVERTER SYSTEM WITH IMPROVED POWER SUPPLY ACCURACY AND SEQUENCING

(71) Applicant: Analog Devices International Unlimited Company, Limerick (IE)

(72) Inventors: Richard James Reay, Mountain View, CA (US); Richard T Owen, Pleasanton, CA (US); Eric C. Welde, Raleigh, NC (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/548,976

(22) Filed: Aug. 23, 2019

(65) Prior Publication Data

US 2021/0058092 A1 Feb. 25, 2021

(51) Int. Cl.
*H03M 1/12* (2006.01)
*G05F 3/08* (2006.01)
*H03M 1/06* (2006.01)
*H03M 1/10* (2006.01)

(52) U.S. Cl.
CPC ............... *H03M 1/12* (2013.01); *G05F 3/08* (2013.01); *H03M 1/06* (2013.01); *H03M 1/0621* (2013.01); *H03M 1/10* (2013.01)

(58) Field of Classification Search
CPC ........ H03M 1/12; H03M 1/06; H03M 1/0621; H03M 1/10
USPC ........ 341/155, 118, 119, 120; 323/280, 282, 323/283
See application file for complete search history.

(56) References Cited

U.S. PATENT DOCUMENTS

| | | |
|---|---|---|
| 5,825,166 A | 10/1998 | Tso et al. |
| 6,600,439 B1 | 7/2003 | Pahr |
| 6,917,185 B2 | 7/2005 | Okamoto |
| 7,440,012 B2 | 10/2008 | Borg et al. |
| 7,449,946 B1 * | 11/2008 | Hoover .................. H03F 1/3211 330/149 |
| 8,008,927 B1 | 8/2011 | Hronik |
| 8,106,806 B2 | 1/2012 | Toyomura et al. |
| 8,310,389 B1 | 11/2012 | Chui et al. |
| 8,436,677 B2 | 5/2013 | Kull et al. |
| 8,860,437 B2 | 10/2014 | Santana et al. |
| 9,152,158 B2 | 10/2015 | Dobkin et al. |
| 9,973,079 B2 * | 5/2018 | Mayes .................. H03M 3/496 |
| 10,608,630 B1 * | 3/2020 | Cical ................... H03K 17/6872 |
| 2002/0121885 A1 * | 9/2002 | Taylor ..................... H03F 3/303 323/280 |
| 2008/0042743 A1 * | 2/2008 | Wong ..................... H03F 3/217 330/10 |

(Continued)

FOREIGN PATENT DOCUMENTS

| | | |
|---|---|---|
| CN | 201191822 Y | 2/2009 |
| EP | 2218185 B1 | 9/2012 |

*Primary Examiner* — Joseph J Lauture
(74) *Attorney, Agent, or Firm* — Schwegman Lundberg & Woessner, P.A.

(57) ABSTRACT

Techniques for improving a power supply accuracy of a precision data converter system, such as analog-to-digital converter circuits (ADCs) and digital-to-analog converter circuits (DACs). Improving the power supply accuracy can enable a reference voltage to be as large as possible, thereby increasing the signal-to-noise-ratio (SNR). The techniques can also simplify power supply sequencing requirements for the data converter system.

13 Claims, 2 Drawing Sheets

(56) References Cited

U.S. PATENT DOCUMENTS

| | | | | |
|---|---|---|---|---|
| 2009/0231174 A1* | 9/2009 | Sutardja | ............... | H03M 1/145 |
| | | | | 341/122 |
| 2011/0234198 A1 | 9/2011 | Lin | | |
| 2013/0057242 A1* | 3/2013 | Zambetti | ............ | H02M 3/1584 |
| | | | | 323/282 |
| 2014/0312866 A1* | 10/2014 | Dobkin | .................. | G05F 1/575 |
| | | | | 323/280 |
| 2014/0333465 A1* | 11/2014 | Elsayed | ............. | H03M 1/0845 |
| | | | | 341/172 |

* cited by examiner

DATA CONVERTER SYSTEM WITH IMPROVED POWER SUPPLY ACCURACY AND SEQUENCING

FIELD OF THE DISCLOSURE

This disclosure relates generally to power supply devices.

BACKGROUND

Electronic systems can include components that rely on a regulated power source. Voltage regulators can be used to provide a circuit supply rail having the regulated voltage by converting available unregulated power to power at specified voltage levels. The purpose of the voltage regulator is to provide a substantially constant output voltage to a load from an input voltage source that may be poorly-specified or fluctuating. Linear regulators can provide both high power supply rejection ratio (PSRR) and low output noise performance. These regulators are widely used to power up noise sensitive rails, such as, but not limited to, power rails for analog-to-digital converters (ADCs), digital-to-analog converters (DACs) and radio frequency (RF) circuits.

SUMMARY OF THE DISCLOSURE

This disclosure is directed to, among other things, techniques for improving a power supply accuracy of a precision data converter system, such as analog-to-digital converter circuits (ADCs) and digital-to-analog converter circuits (DACs). Improving the power supply accuracy can enable a reference voltage to be as large as possible, thereby increasing the signal-to-noise-ratio (SNR). The techniques described can also simplify power supply sequencing requirements for the data converter system.

In some aspects, this disclosure is directed to a power supply circuit comprising a voltage regulator circuit configured to output a regulated output voltage, wherein the voltage regulator circuit is configured to use a reference voltage other than ground potential as its reference.

In some aspects, this disclosure is directed to a method of operating a power supply circuit, the method comprising: referencing a voltage regulator circuit to a reference voltage other than ground potential; and generating, by the voltage regulator circuit, a regulated output voltage using the reference voltage.

In some aspects, this disclosure is directed to a data converter system with improved power supply accuracy, the data converter system comprising: a voltage regulator circuit configured to output a regulated output voltage, wherein the voltage regulator circuit is configured to use a reference voltage other than ground potential as its reference; and a data converter circuit coupled to an output of the voltage regulator circuit.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This disclosure describes system-level techniques for improving a power supply accuracy of a precision data converter system, such as analog-to-digital converter circuits (ADCs) and digital-to-analog converter circuits (DACs). Improving the power supply accuracy can enable a reference voltage to be as large as possible, thereby increasing the signal-to-noise-ratio (SNR). The techniques described can also simplify power supply sequencing requirements for the data converter system.

Figure 1:
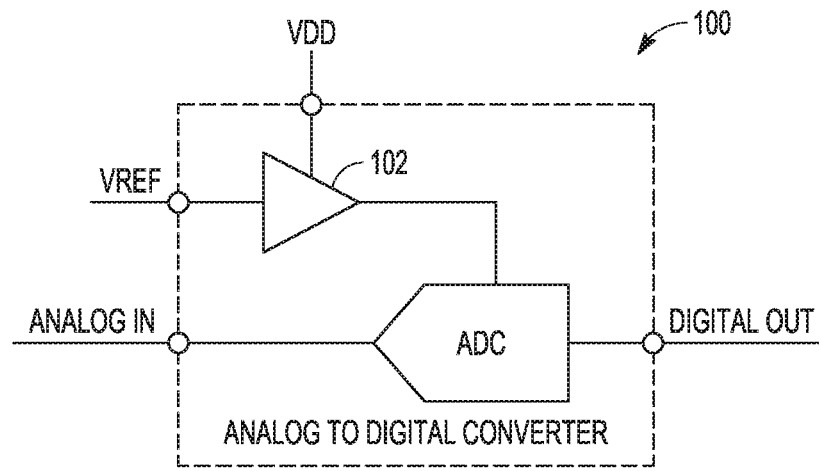
FIG. 1 is a simplified block diagram of an example of a configuration of an ADC circuit coupled to a reference voltage VREF and a power supply voltage VDD.

FIG. 1 is a simplified block diagram of an example of a configuration of an ADC circuit 100 coupled to a reference voltage VREF and a power supply voltage VDD. High performance data converters often include an internal buffer circuit 102, e.g., unity-gain buffer circuit, that can isolate the external precision reference VREF from disturbances caused by the ADC core.

The internal reference buffer circuit 102 can require a certain amount of voltage headroom, which can limit how high the reference voltage VREF can be. For example, a typical headroom requirement might be VDD>VREF+0.3V. To improve the SNR of the system, it can be desirable to make the reference voltage VREF as high as possible. One way to maximize the reference voltage VREF is to make the power supply voltage VDD as high as possible. However, increasing the power supply voltage VDD can be limited by the maximum VDD specified by the ADC circuit, and the tolerance of the power supply circuit that generates VDD. With a tighter power supply tolerance, the minimum VDD is higher, and the reference can be higher.

Figure 2:
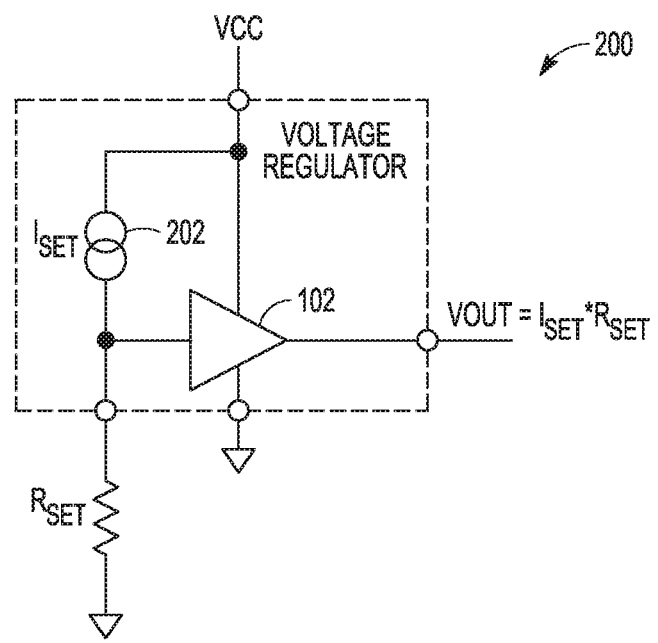
FIG. 2 is a simplified block diagram of voltage regulator circuit that can be coupled to a data converter circuit.

FIG. 2 is a simplified block diagram of a voltage regulator circuit that can be coupled to a data converter circuit. The voltage regulator circuit 200 can provide a predetermined and substantially constant output voltage level from an unregulated input voltage VCC.

The voltage regulator can include an internal current source 202, configured to provide a constant current ISET, coupled to a set resistor RSET, e.g., an external resistor. The output voltage VOUT of the voltage regulator circuit can be set by the product of the current ISET of the current source 202 and the set resistor RSET. The current ISET can vary ±2% over temperature and VCC, and if the set resistor RSET is a 1% resistor, VOUT can vary by ±3%.

For an ADC circuit with a maximum VDD voltage of 5.5V and 0.3V buffer headroom, then the reference voltage VREF should be less than 4.88V (5.5V*0.94−0.3V). Because 4.88V is not a standard precision reference value, either a 4.096V reference voltage should be used, or a smaller reference amplified to 4.88V, which can compromise accuracy. Although using 0.1% resistors can result in an improvement, it is not enough to enable using a 5.000V reference.

The present inventors have recognized that accuracy of the VDD voltage, e.g., supplied to a data converter, can be greatly improved by using a voltage regulator circuit configured to use a reference voltage other than ground potential as its reference.

Figure 3:
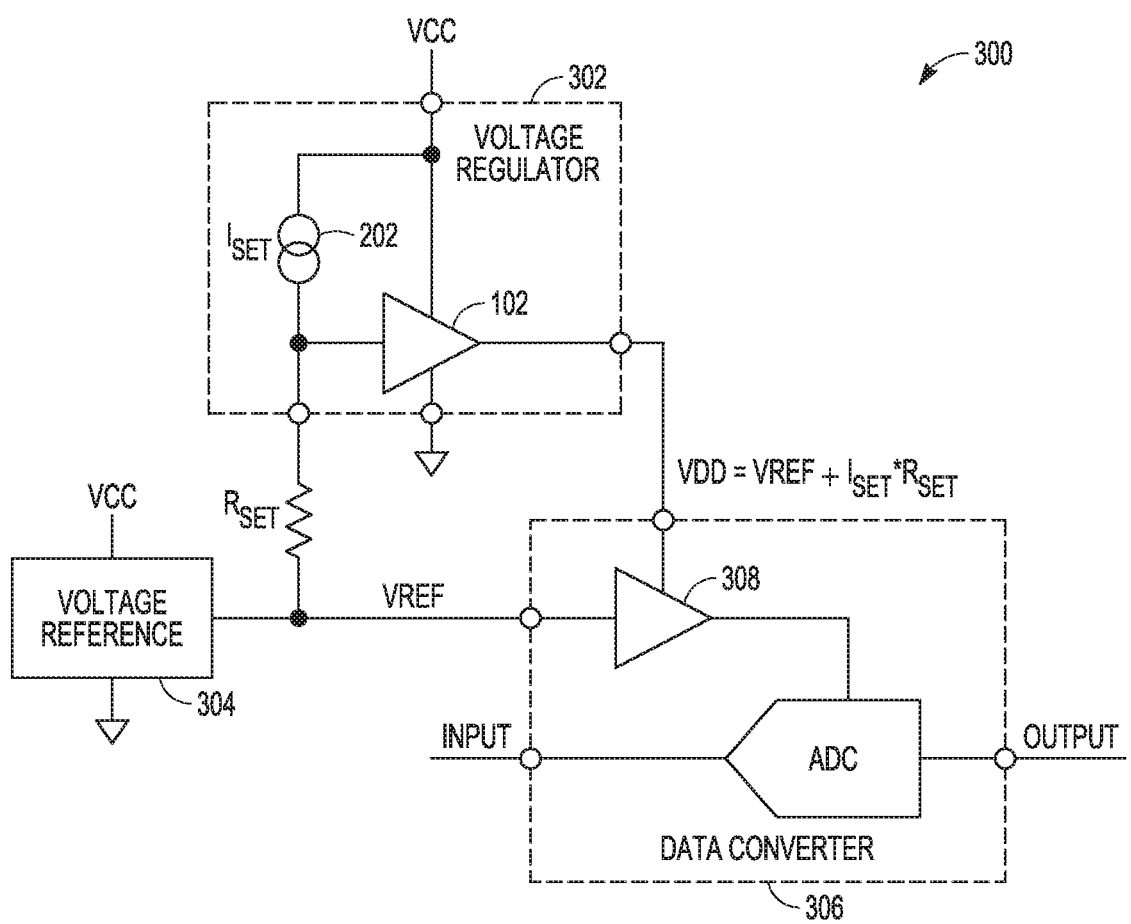
FIG. 3 is an example of a power supply circuit that can implement various techniques of this disclosure.

FIG. 3 is an example of a power supply circuit that can implement various techniques of this disclosure. The power supply circuit 300 can include a voltage regulator circuit 302 configured to generate a regulated output voltage VDD. A reference voltage circuit 304 can generate a reference voltage VREF. In accordance with this disclosure, the voltage regulator circuit 302 is configured to use a reference voltage VREF other than ground potential as its reference.

In the example shown in FIG. 3, the voltage regulator circuit 302 can be coupled to or include a set resistor RSET, where the set resistor is referenced to the reference voltage VREF other than ground potential. In some examples, the voltage regulator circuit 302 can include a current source 202 and a buffer circuit 102, e.g., unity-gain buffer circuit, having an input coupled to the current source 202 and the set resistor RSET, where the buffer circuit 102 is configured to output the regulated output voltage. The output voltage VDD of the voltage regulator circuit 302 is VREF+(ISET*RSET).

In a non-limiting specific example for purposes of explanation, if VREF=5.000V, the voltage across RSET can be 400 mV, resulting in VDD=5.4V±0.22% (±12 mV). Rather than providing a voltage VDD that is 5.4V above ground potential, the techniques of this disclosure allow a voltage VDD that is 400 mV above VREF, for example. The voltage across the set resistor RSET, which sets the power supply, has been reduced by an order of magnitude from 5.4V to 0.4V. Any tolerances in the current source or the set resistor can be attenuated by an order of magnitude.

This tight control can allow the reference voltage VREF to be as high as possible, thus improving SNR, while maintaining VDD safely away from its maximum specified voltage. Another benefit of such tight control of the voltage VDD is that any errors caused by a change in the power supply, e.g., offset, full-scale, and linearity, can be greatly reduced.

In some examples, the output voltage VDD of the voltage regulator circuit 302 can be coupled to a data converter circuit 306. The data converter circuit 306 can be an ADC circuit or a DAC circuit. For example, the ADC circuit could be a successive approximation register (SAR) ADC circuit.

In some examples, the data converter circuit 306 can include a buffer circuit 308, e.g., a unity gain, and the output of the voltage regulator circuit 302 can be coupled to the buffer circuit 308. As seen in the example shown in FIG. 3, the buffer circuit 308 can receive the reference voltage VREF.

The techniques of this disclosure can also simplify supply sequencing. In some configurations, it can be desirable that VDD power up before VREF to avoid forward biasing internal electrostatic discharge (ESD) protection diodes and potentially causing latch-up. Using various techniques of this disclosure, the output voltage VDD of the voltage regulator circuit 302 can track the reference voltage VREF as it rises, ensuring that VREF is never higher than VDD.

In some configurations, ESD diodes can be coupled in a circuit between the reference voltage VREF and ground and the reference voltage VREF and VDD. In a typical operation, the voltage VDD is above VREF and, as such, the ESD diodes never turn ON. However, if both the voltage VDD and the reference voltage VREF start at ground, and if the reference voltage VREF is applied before VDD, then diodes that are normally reverse biased can become forward biased, which can cause odd behavior. To avoid forward biasing the ESD diodes, it can be desirable to power up the voltage VDD first and then apply the reference voltage VREF.

Using the techniques of this disclosure, the power supply voltage VDD automatically tracks with the reference voltage VREF because the voltage regulator circuit that generates the voltage VDD uses the reference voltage VREF as its reference. With these techniques, the voltage VDD can track with the reference voltage VREF as it rises, ensuring that VREF is never higher than VDD.

NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A data converter system comprising:
a voltage regulator circuit configured to output a regulated output voltage, wherein the voltage regulator circuit includes a buffer circuit having an input coupled to a first terminal of a set resistor, and wherein a second terminal of the set resistor is coupled to a reference voltage other than ground potential; and
a data converter circuit coupled to an output of the voltage regulator circuit, wherein the data converter circuit includes a buffer circuit, and wherein the output of the voltage re ulator circuit is coupled to the buffer circuit of the ADC circuit, and
wherein the buffer circuit of the data converter circuit is configured to receive the reference voltage.

2. The data converter system of claim 1, wherein the voltage regulator circuit includes a current source, and wherein the input of the buffer circuit is coupled to the current source and the set resistor, and wherein the buffer circuit is configured to output the regulated output voltage.

3. The data converter system of claim 1, wherein the buffer circuit of the voltage regulator circuit is a unity gain buffer circuit.

4. The data converter system of claim 1, wherein the buffer circuit of the ADC circuit is a unity gain buffer circuit.

5. The data converter system of claim 1, wherein the data converter circuit is an analog-to-digital converter circuit.

6. A method of operating a data converter system, the method comprising:
referencing a voltage regulator circuit having a buffer circuit to a reference voltage other than ground potential, including:
coupling an input of the buffer circuit to a first terminal of a set resistor; and
coupling a second terminal of the set resistor to the reference voltage other than ground potential; and
generating, by the voltage regulator circuit, a regulated output voltage using the reference voltage;
coupling an output of the voltage regulator circuit to a buffer circuit of a data converter circuit; and
coupling the buffer circuit of the data converter circuit to the reference voltage.

7. The method of claim 6, wherein the voltage regulator circuit includes a current source, and wherein generating, by the voltage regulator circuit, the regulated output voltage using the reference voltage includes:
generating, by the voltage regulator circuit, the regulated voltage which is the reference voltage other than ground potential plus the product of a current of the current source and a resistance of the set resistor.

8. The method of claim 7, the method comprising:
generating, by the buffer circuit, the regulated voltage.

9. The method of claim 6, wherein the regulated output voltage automatically tracks with the reference voltage as the reference voltage changes.

10. The method of claim 6, wherein coupling the output of the voltage regulator circuit to the buffer circuit of the data converter circuit includes coupling the output of the voltage regulator circuit to the buffer circuit of an analog-to-digital converter circuit.

11. A data converter system with improved power supply accuracy, the data converter system comprising:
a voltage regulator circuit configured to output a regulated output voltage, wherein the voltage regulator circuit includes a buffer circuit having an input coupled to a first terminal of a set resistor, and wherein a second terminal of the set resistor is coupled to a reference voltage other than ground potential; and
a data converter circuit coupled to an output of the voltage regulator circuit, wherein the data converter circuit includes a buffer circuit, and wherein the output of the voltage regulator circuit is coupled to the buffer circuit of the data converter circuit.

12. The data converter system of claim 11, wherein the data converter circuit is an analog-to-digital converter circuit.

13. The data converter system of claim 11, wherein the voltage regulator circuit includes a current source, and wherein the input of the buffer circuit is coupled to the current source and the set resistor, and wherein the buffer circuit is configured to output the regulated output voltage.

* * * * *